United States Patent
Kondo et al.

(10) Patent No.: US 8,270,448 B2
(45) Date of Patent: Sep. 18, 2012

(54) SURFACE EMITTING SEMICONDUCTOR LASER

(75) Inventors: Takashi Kondo, Kanagawa (JP); Kazutaka Takeda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/843,361

(22) Filed: Jul. 26, 2010

(65) Prior Publication Data

US 2011/0182316 A1 Jul. 28, 2011

(30) Foreign Application Priority Data

Jan. 27, 2010 (JP) ................................ 2010-015722

(51) Int. Cl.
*H01S 5/00* (2006.01)
(52) U.S. Cl. ............ 372/50.124; 372/45.01; 372/46.01; 372/46.013; 372/50.11
(58) Field of Classification Search ................ 372/45.01, 372/46.01, 46.013, 50.11, 50.124
See application file for complete search history.

(56) References Cited

U.S. PATENT DOCUMENTS

| | | | | |
|---|---|---|---|---|
| 5,493,577 A | * | 2/1996 | Choquette et al. | ....... 372/46.013 |
| 5,764,669 A | * | 6/1998 | Nagai | ...................... 372/46.015 |
| 2005/0089074 A1 | | 4/2005 | Koelle et al. | |
| 2008/0279229 A1 | * | 11/2008 | Suzuki et al. | .................. 372/19 |

FOREIGN PATENT DOCUMENTS

JP A 2005-129960 5/2005

OTHER PUBLICATIONS

Unold et al., "Improving Single-Mode VCSEL Performance by Introducing a Long Monolithic Cavity," IEEE Photonics Technology Letters, vol. 12, No. 8, Aug. 2000, pp. 939-941.
Mahmoud et al., "Analysis of longitudinal mode wave guiding in vertical-cavity surface-emitting lasers with long monolithic cavity," Applied Physics Letters, vol. 78, No. 5, Jan. 2001, pp. 586-588.

* cited by examiner

*Primary Examiner* — Yuanda Zhang
(74) *Attorney, Agent, or Firm* — Oliff & Berridge, PLC

(57) ABSTRACT

A surface emitting semiconductor laser includes: a substrate; a first semiconductor multilayer reflector of a first conduction type that is formed on the substrate and is composed of stacked pairs of relatively high refractive index layers and relatively low refractive index layers; a cavity region that is formed on the first semiconductor multilayer reflector and includes an active region; and a second semiconductor multilayer reflector of a second conduction type that is formed on the cavity region and is composed of stacked pairs of relatively high refractive index layers and relatively low refractive index layers. A cavity length of a cavity that includes the cavity region and the active region between the first semiconductor multilayer reflector and the second semiconductor multilayer reflector is greater than an oscillation wavelength.

13 Claims, 12 Drawing Sheets

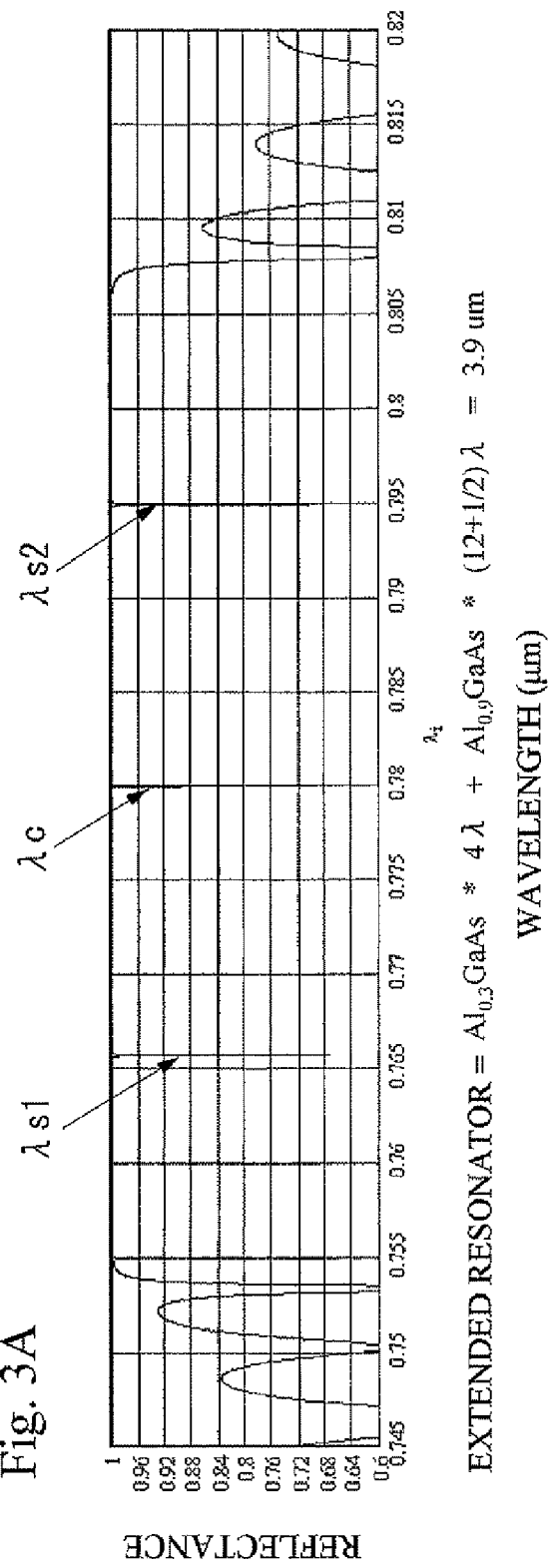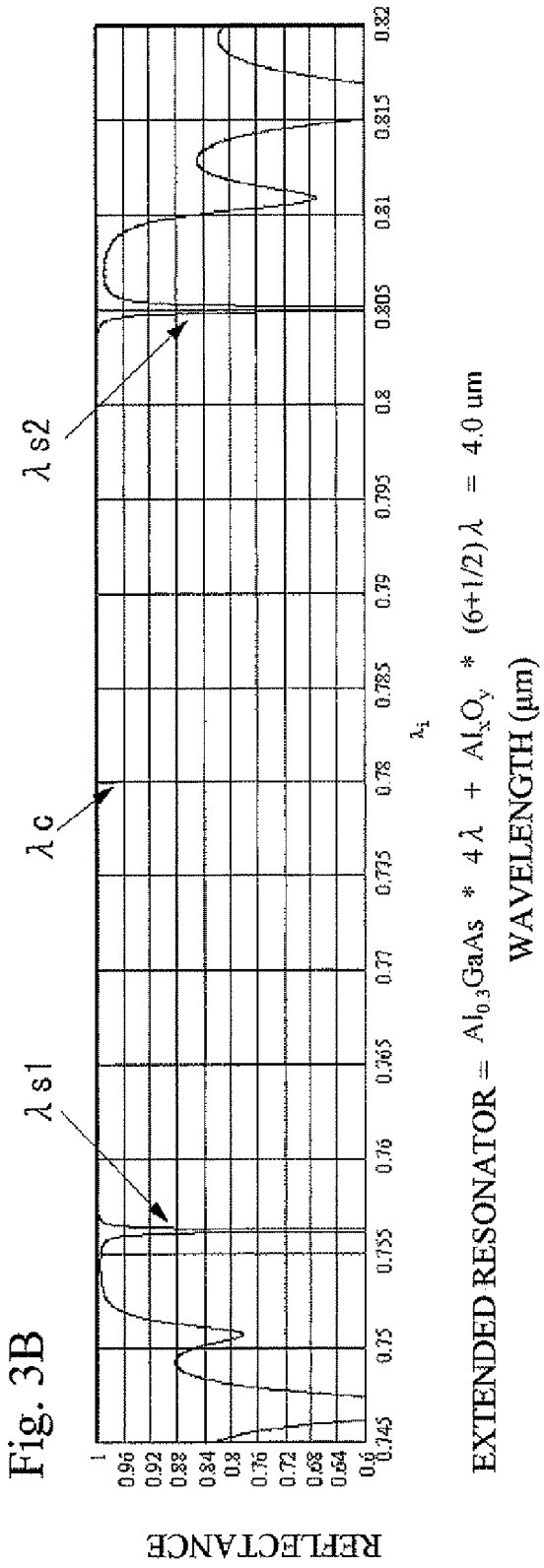

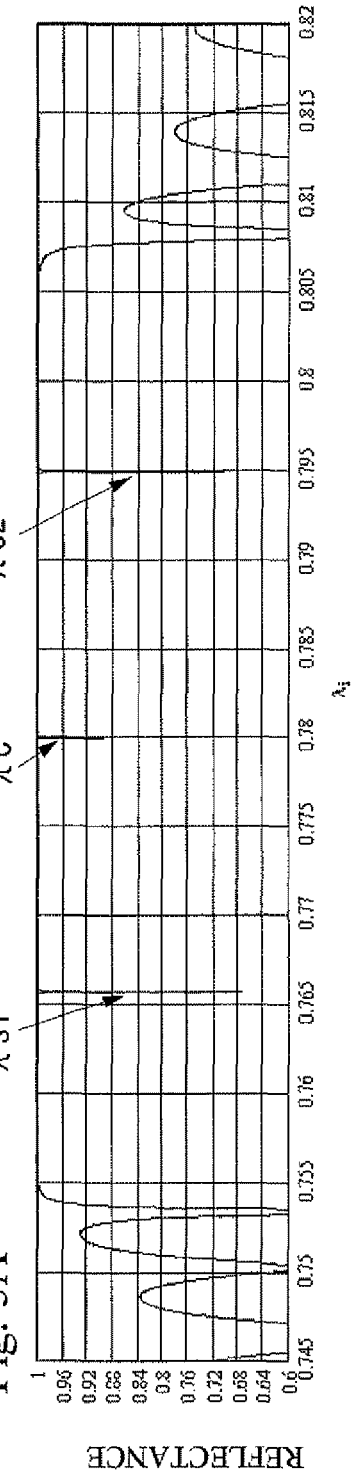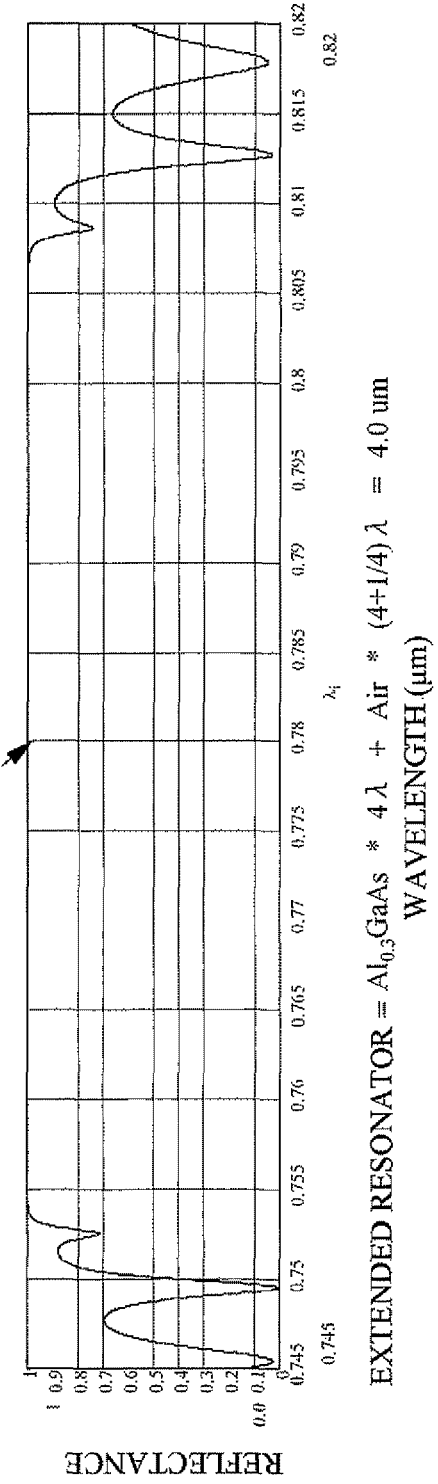
Fig. 5A  EXTENDED RESONATOR = $Al_{0.3}GaAs * 4\lambda + Al_{0.9}GaAs * (12+1/4)\lambda = 3.9$ μm
Fig. 5B  EXTENDED RESONATOR = $Al_{0.3}GaAs * 4\lambda + Air * (4+1/4)\lambda = 4.0$ μm

SURFACE EMITTING SEMICONDUCTOR LASER

CROSS-REFERENCE TO RELATED APPLICATION

This application is based on and claims priority under 35 USC 119 from Japanese Patent Application No. 2010-015722 filed on Jan. 27, 2010.

BACKGROUND (i) Technical Field

The present invention relates to a surface emitting semiconductor laser, a surface emitting semiconductor laser device, an optical transmission device and an information processing apparatus.

(ii) Related Art

A surface emitting semiconductor laser, which is typically a vertical cavity surface emitting laser: VCSEL), is utilized as an optical source in a communication device and an image forming apparatus. The VCSEL used as the optical source is required to have improved optical output and electro static discharge (ESD) in the single transverse mode and to have lengthened life by reducing the resistance and heat radiation performance.

A typical selective oxidation type VCSEL has a current confining layer in which an oxide aperture formed by selective oxidation is formed within a vertical cavity structure. The oxide aperture has a function of confining current injected via an electrode and injecting high-density current in an active region. The oxide aperture has a further function of confining light generated in the active region in the center of emission due to the difference in refractive index between the outside of the oxide aperture and the inside thereof. The single transverse mode may be realized by reducing the diameter of the oxide aperture of the current confining layer to about 3 micron. As the oxide aperture diameter reduces, the resistance of the laser increases and the heat generation temperature rises, so that life may be shortened. Further, a reduced oxide aperture diameter results in a reduced optical output.

An increased cavity length may be a solution to realize higher optical output and longer life of VCSEL. A VCSEL having an increased cavity length has a cavity that may be typically defined by lengthening the cavity by 3 to 4 μm (approximately equal to ten to twenty times the oscillation wavelength). The increased cavity length increases the difference in optical loss between the primary transverse mode having a small divergence angle and a high-order transverse mode having a large divergence angle. Thus, the single transverse mode may be realized even using an increased oxide aperture diameter. In the VCSEL with the longer cavity, the oxide aperture diameter may be increased up to about 8 μm, and the optical output may be increased up to about 5 mW.

SUMMARY

According to an aspect of the present invention, there is provided a surface emitting semiconductor laser including: a substrate; a first semiconductor multilayer reflector of a first conduction type that is formed on the substrate and is composed of stacked pairs of relatively high refractive index layers and relatively low refractive index layers; a cavity region that is formed on the first semiconductor multilayer reflector and includes an active region; and a second semiconductor multilayer reflector of a second conduction type that is formed on the cavity region and is composed of stacked pairs of relatively high refractive index layers and relatively low refractive index layers, a cavity length of a cavity that includes the cavity region and the active region between the first semiconductor multilayer reflector and the second semiconductor multilayer reflector being greater than an oscillation wavelength, and the cavity region including an electrically conductive region of the first conduction type in proximity to the active region, and a low refractive index region that is interposed between the electrically conductive region and the first semiconductor multilayer reflector and has a smaller refractive index than that of the electrically conductive region.

BRIEF DESCRIPTION OF THE DRAWINGS

FIGS. 1-1 is a cross-sectional view of a VCSEL with an extended cavity and an oxidation suppressing layer in accordance with a first exemplary embodiment of the present invention;

FIG. 3A is a graph that illustrates a relation between the reflection band and the resonance frequency in a typical ordinary VCSEL with an extended cavity, and FIG. 3B is a graph that illustrates a relation between the reflection band and the resonance frequency in the VCSEL with the extended cavity in accordance with the first embodiment;

FIG. 5A is a graph that is the same as that of FIG. 3A, and FIG. 5B is a graph that illustrates a relation between the reflection band and the oscillation resonance frequency in the VCSEL with the extended cavity in accordance with the second exemplary embodiment;

DETAILED DESCRIPTION

A description will now be given of exemplary embodiments of the present invention with reference to the accompanying drawings. In the following, surface emitting semiconductor lasers of selective oxidation type will be discussed and such lasers will now be referred to as VCSELs. The dimensions of VCSELs illustrated may be emphasized for the purpose of facilitating better understanding and may be different from the actual dimensions thereof.

Figure 1:
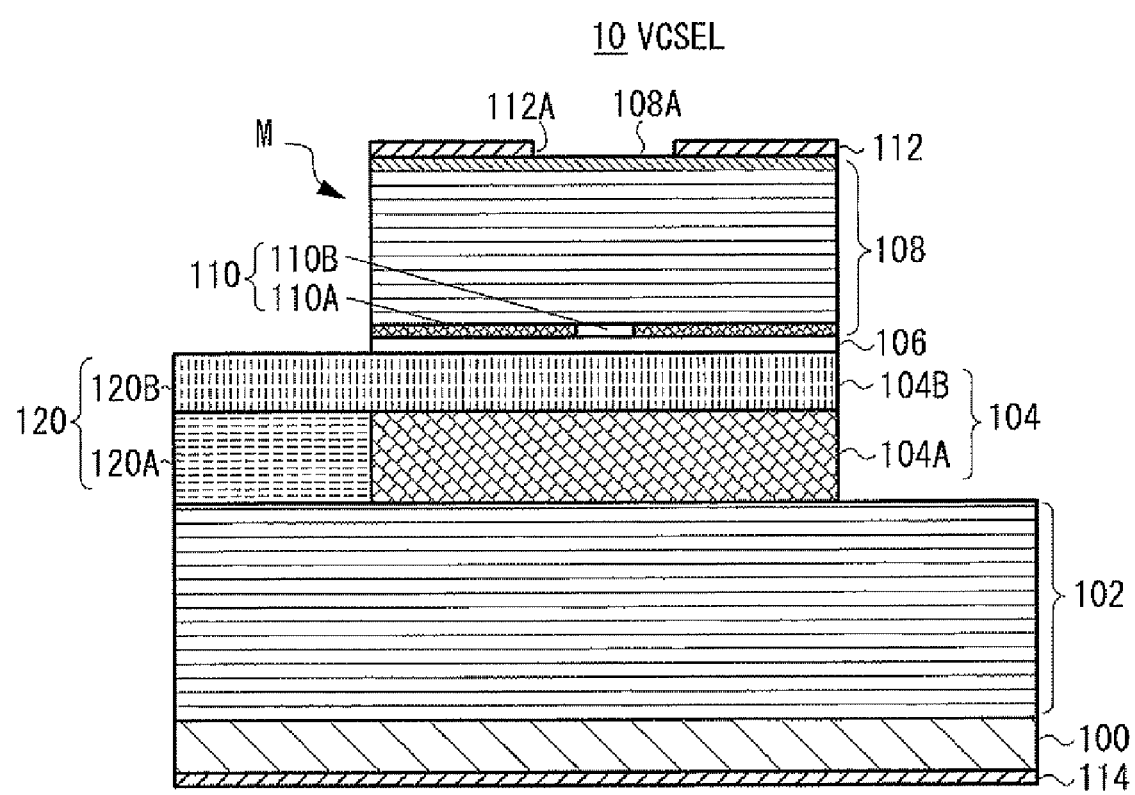
FIG. 1 is a cross-sectional view of a VCSEL with an extended cavity in accordance with a first exemplary embodiment of the present invention.
Figure 1:
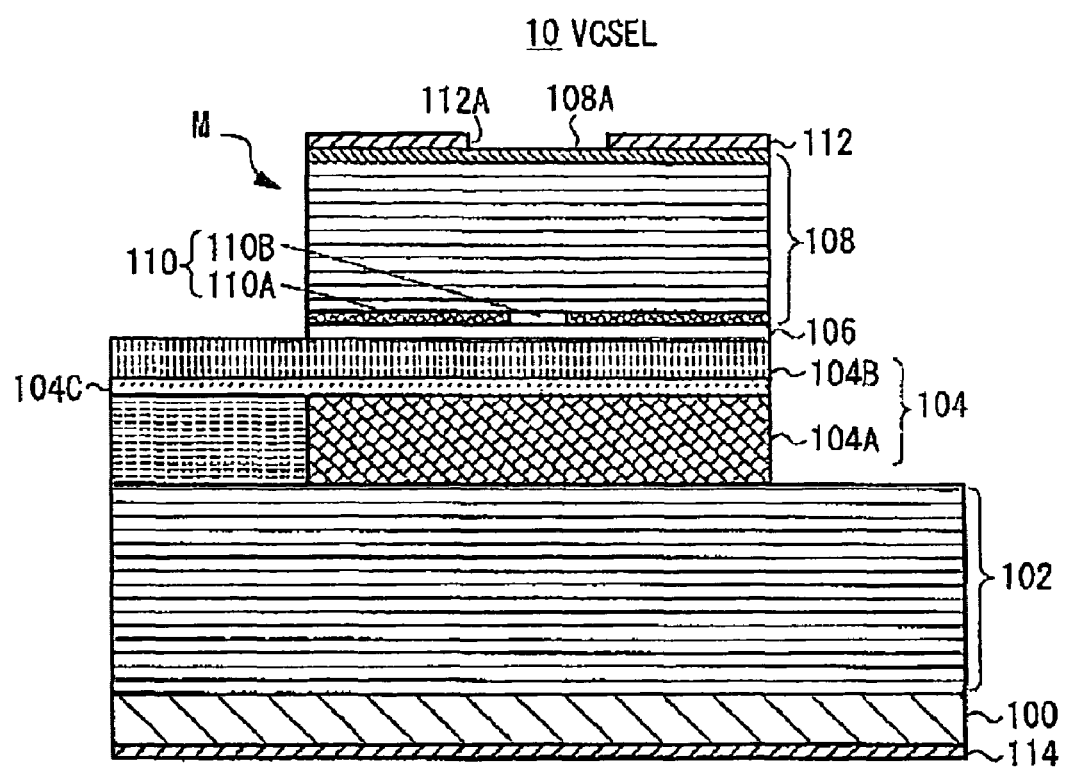

FIG. 1 is a cross-sectional view of a VCSEL in accordance with a first exemplary embodiment of the present invention. Referring to FIG. 1, a VCSEL 10 of the present exemplary embodiment has an n-type GaAs substrate 100 on which the following layers are stacked. An n-type lower distributed Bragg reflector (DBR) 102 formed by alternately staking AlGaAs layers having different Al compositions is provided on the n-type GaAs substrate 100. A cavity region 104, which extends a cavity length, is provided on the lower DBR 102. An active region 106, which includes a quantum well active layer sandwiched between upper and lower spacer layers, is formed on the cavity region 104. A p-type upper DBR 108 formed by alternately stacking AlGaAs having different Al compositions, is formed on the active region 106.

The n-type lower DBR 102 has a multilayer structure formed by stacking pairs of Al0.9Ga0.1As layers and Al0.3Ga0.7As layers, each of which layers has a thickness of λ/4 nr where λ is the oscillation wavelength, and nr is the refractive index of the medium. The $Al_{0.9}Ga_{0.1}As$ layers and $Al_{0.3}Ga_{0.7}As$ layers may be stacked alternately by 47 periods. The carrier concentration of the n-type lower DBR 102 after doping with silicon of an n-type impurity may, for example, be $3 \times 10^{18}$ cm$^{-3}$.

The VCSEL 10 has an extended cavity structure, which may be realized by the cavity region 104 provided on the lower DBR 102. The cavity region 104 has a thickness of about 3 to 4 μm, and an optical thickness of 10.5λ where λ is the oscillation wavelength. The cavity region 104 may be referred to as a cavity extending region or a cavity space. A cavity of the VCSEL includes the cavity region 104 and the active region 106. A cavity length is the length of the cavity formed between the n-type lower DBR 102 and the p-type upper DBR 108.

The cavity region 104 is a monolithic layer formed by epitaxial growth. Thus, the cavity region 104 may be made of a material such as AlGaAs, GaAs or AlAs, which has the same lattice constant as the GaAs substrate 100 or a lattice constant that matches that of the GaAs substrate 100. In the present exemplary embodiment, the cavity region 104 is configured to include an oxide region 104A and an electrically conductive region 104B of n type formed on the oxide region 104A. The oxide region 104A is formed on the lower DBR 102 and serves as a low refractive index region. The conductive region 104B is close to the active region 106. Preferably, the oxide region 104A is formed by oxidizing the n-type AlAs layer to $Al_xO_y$. The oxide region has an optical thickness of 6.5λ, and has a refractive index $n_A$ of about 1.5 at an oscillation wavelength of 780 nm. The conductive region 104B may be an n-type $Al_{0.3}Ga_{0.7}As$ layer and has an optical thickness of 4λ, while having a refractive index $n_n$ of about 3.47 at an oscillation wavelength of 780 nm.

The oxide region 104A is formed so as to be located just below at least the whole main surface of the active region 106 (surface orthogonal to the film thickness direction). In other words, the oxide region 104A presents a low refractive index region on the lower DBR 102 that functions as the cavity. The oxide region 104A has a smaller refractive index than the conductive region 104B. By providing a layer having a relatively small refractive index within the cavity region 104, the effective cavity length may be reduced. Preferably, the cavity length may be reduced more efficiently by setting the optical thickness of the low refractive index region of the cavity region 104 greater than the oscillation wavelength λ.

The Al composition of the conductive region 104B is selected within the range of 0.3 to 0.9 of the Al composition of the lower DBR 102. The oxide region 104A is not limited to AlAs but may be composed of AlGaAs having a greater Al composition than that of AlGaAs of the lower DBR 102 (in this case, the Al composition is greater than 0.9). Preferably, a GaAs layer, which functions as an oxidation suppressing layer 104C, is interposed between the oxide region 104A and the conductive region 104B in order to restrain propagation of oxidation towards the conductive region 104B in a case where the oxide region 104A is formed by oxidizing a semiconductor layer such as the AlAs layer, as shown in FIGS. 1-1. The GaAs layer is hard to be oxidized because it does not include Al. The GaAs layer may be very thin and may be a few nm.

An electrically conductive current path region 120 for making an electrical connection between the lower DBR 102 and the conductive region 104B is formed in an outer circumferential part of the cavity region 104. In the present exemplary embodiment, the current path, region 120 includes an extension region 120B, and an non-oxide region 120A. The extension region 120B is extended outwards from the conductive region 10413 located just below the active region 106. The non-oxide region A is located just below the extension region 120B and is composed of n-type AlAs. Thus, the carrier (electrons) injected from the n-side electrode 114 flow through the non-oxide region 120A of the cavity region 104 and the extension region 120B, and is injected in the active layer of the active region 106 via the conductive region 104B.

The lower spacer layer of the active region 106 may be an undoped Al0.6Ga0.4As layer. The quantum well active layer may be composed of an undoped $Al_{0.11}Ga_{0.89}As$ quantum well layer and an undoped $Al_{0.3}Ga_{4.7}As$ barrier layer. The upper spacer layer may be an undoped $Al_{0.6}Ga_{0.4}As$ layer. Preferably, the thickness of the active region 106 may be equal to the oscillation wavelength λ or a multiple thereof.

The p-type upper DBR 108 may be a multilayer that includes a pair of a p-type Al0.9Ga0.1As layer and a p-type Al0.3Ga0.7As layer, and the thickness of each layer may be λ/4 nr. For example, the p-type upper DBR 108 is configured to have multiple $Al_{0.9}Ga_{0.1}As$ layers and p-type $Al_{0.3}Ga_{0.7}As$ layers that are alternately stacked by 23 periods. The carrier concentration after doping with carbon that is a p-type impurity may, for example, be $3 \times 10^{18}$ cm$^{-3}$. Preferably, a contact layer 108A formed of, for example, p-type GaAs, is formed on the uppermost layer of the upper DBR 108. Preferably, a current confining layer 110 made of p-type AlAs or AlGaAs having a high Al composition is formed below or within the lowermost layer of the upper DBR 108.

The semiconductor layers from the upper DBR 108 to the cavity region 104 are etched to define a cylindrical mesa (post structure) M on the GaAs substrate 100. A given thickness remains in at least the conductive region 104B of the cavity region 104. The extension region 120E remains in the outer circumferential part of the conductive region 104B just below the active region 106. The current confining layer 110 is exposed from the side surface of the mesa M, and includes an oxide region 110A formed by selective oxidation from the side surface of the mesa M, and an electrically conductive oxide aperture 110E surrounded by the oxide region 110A. In the process of oxidizing the VCSEL, the current confining layer 110 is oxidized at a rate higher than the rate at which the AlGaAs layers of the lower DBR 102 and the upper DBR 108 are oxidized. The oxide region 110A is oxidized towards the inside of the mesa M from the side surface thereof at an almost constant rate. Thus, the planar shape of the oxide aperture 110B parallel to the main surface of the GaAs substrate 100 has a circular shape that reflects the outer shape of the mesa M, and the center of the oxide aperture 110B is aligned with the optical axis corresponding to the axial direction of the mesa M. In order to obtain the primary transverse mode, the VCSEL 10 with the extended cavity may be configured to have a greater diameter of the oxide aperture 110E than that of the ordinary VCSEL. For example, the diameter of the oxide aperture 110B may be increased up to 7 to 8 μm.

The uppermost layer of the mesa M is a p-side electrode 112, which has a ring shape, and is made of a metal such as a laminate of Ti/Au. The p-side electrode 112 is in ohmic contact with the contact layer of the upper DBR 108. A light emission aperture 112A having a circular shape is formed in the p-side electrode 112. The center of the light emission aperture 112A is aligned with the optical axis of the mesa M. An n-side electrode 114 is formed on a back surface of the GaAs substrate 100. The VCSEL including the mesa M is covered with an interlayer insulating film, and an interconnection for making an external connection is formed on the interlayer insulating film.

The VCSEL configured as described above has a greater cavity length than that of the ordinary VCSEL, which results in an optical loss between the primary transverse mode and a high-order transverse mode. Thus, oscillation in the single transverse mode is enabled even using a greater oxide aperture diameter (about 7 μm) than that (about 3 μm or less) of the oxide aperture of the ordinary VCSEL. In the exemplary embodiment, a laser beam of an oscillation wavelength of about 780 nm is emitted from a light emission aperture 112A.

Figure 2A:
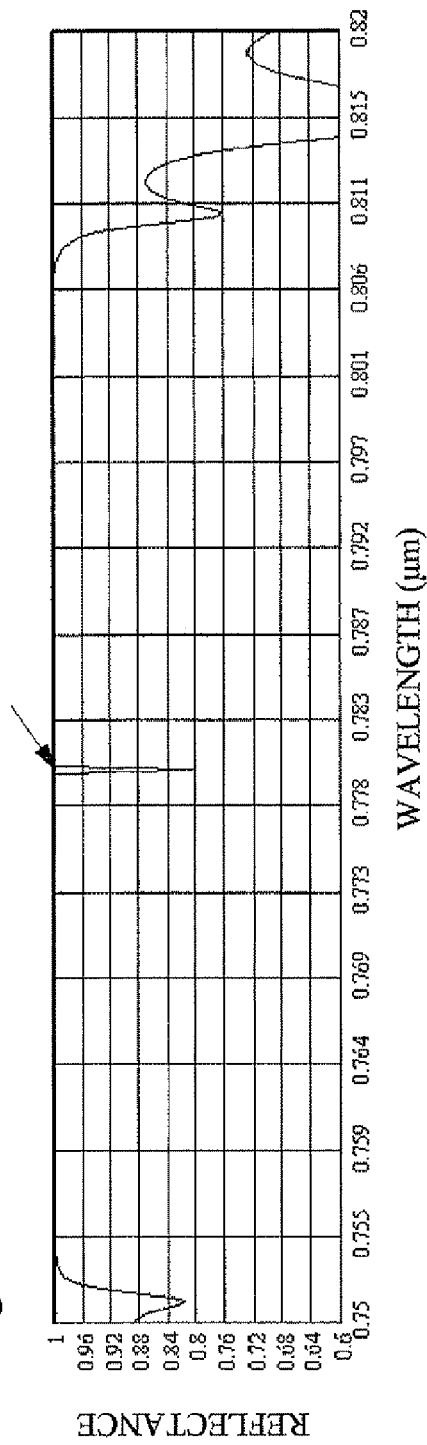
FIG. 2A is a graph that illustrates a relation between the reflection band and the resonance wavelength in an ordinary VCSEL.
Figure 2B:
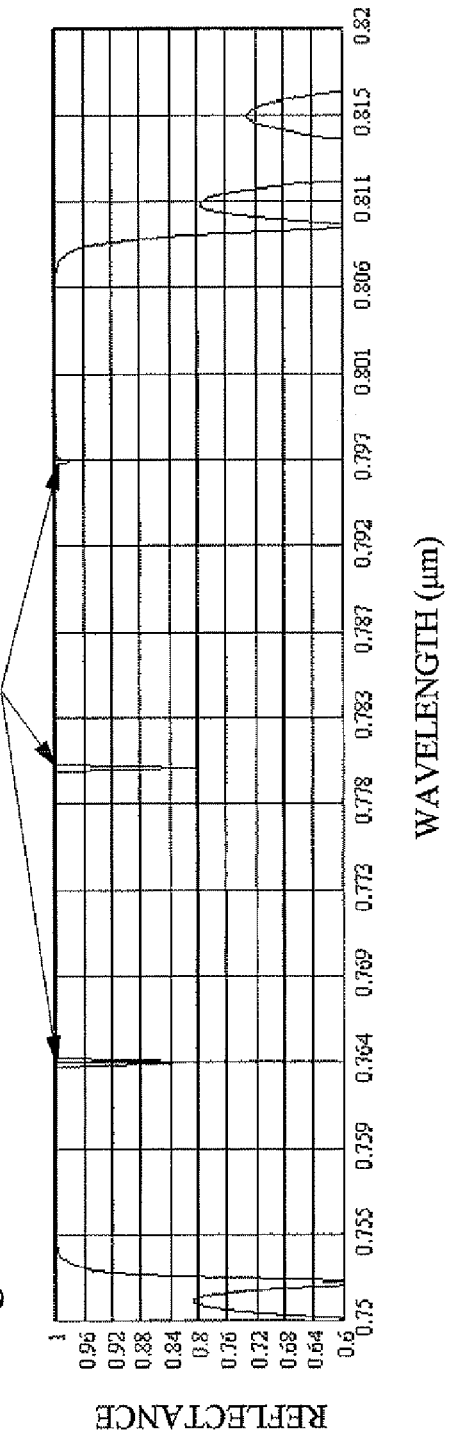
FIG. 2B is a graph that illustrates a relation between the reflection band and the resonance wavelength in the VCSEL with an extended cavity.

A description will now be given of switching (hopping) of the transverse mode of the VCSEL with the extended cavity. FIG. 2A is a graph that illustrates a resonance wavelength of the ordinary VCSEL, and FIG. 2B is a graph that illustrates resonance wavelengths of the VCSEL with the extended cavity. The graphs of these figures are obtained by calculation using reflection profiles of pairs of layers that form the DBRs.

The graph of FIG. 2A indicates the reflection band of the DBRs of the ordinary VCSEL that does not have the cavity region 104. The vertical axis of FIG. 2A is the refractive index, and the horizontal axis thereof is the wavelength. When the ordinary VCSEL operates in the single transverse mode, the ordinary VCSEL has a single resonance wavelength, namely, a single longitudinal mode because the cavity length is small. In the VCSEL illustrated, there is a resonance wavelength of about 780 nm. The graph of FIG. 2B illustrates resonance wavelengths of the DBRs of the VCSEL with the extended cavity. In the VCSEL with the extended cavity, multiple resonance wavelengths occur due to the increased cavity length, and the number of resonance wavelengths that occur is proportional to the cavity length. In the example illustrated, there are three resonance wavelengths of about 760 nm, 780 nm and 797 nm. Thus, in the VCSEL with the extended cavity, switching of the resonance wavelength (switching of the longitudinal mode) is liable to take place due to variation in the operation current, and a kink may occur in the IL characteristic. Further, switching of the wavelength is not suitable for high-speed modulation of VCSEL.

FIG. 3A illustrates a relation between the reflectance and the resonance wavelength of the extended cavity interposed between the p-type upper DBR formed by 23 pairs of layers and the n-type lower DBR formed by 47 pairs of layers. The extended cavity (which corresponds to the cavity region 104) is formed by forming an $Al_{0.3}Ga_{0.7}As$ layer by a thickness of $4\lambda$ and forming an $Al_{0.9}Ga_{0.1}As$ layer by $12.5\lambda$. The total thickness of the extended cavity is equal to 3.9 μm. That is, $Al_{0.3}Ga_{0.7}As\times 4\%+Al_{0.9}Ga_{0.1}As\times 12.5\lambda 3.9$ μm. As illustrated in the graph of FIG. 3A, there are a center resonance wavelength $\lambda c$ of about 780 nm, a side resonance wavelength $\lambda s1$ of about 765 nm, and another side resonance wavelength $\lambda s2$ of about 795 nm.

A graph of FIG. 3B relates to the VCSEL of the present exemplary embodiment with the extended cavity (corresponding to the cavity region 104) formed by an $Al_{0.3}Ga_{0.7}As$ layer by $4\lambda$ and forming an $Al_xO_y$ by $6.5\lambda$. The total thickness of the extended cavity is equal to 4.0 μm. That is, $Al_{0.3}Ga_{0.7}As\times 4\lambda+Al_xO_y\times 6.5\lambda=4.0$ μm.

In the VCSEL of the present exemplary embodiment, the center resonance wavelength $\lambda c$ is about 780 nm, and the side resonance wavelengths $\lambda s1$ and $\lambda s2$ are about 755 nm and 805 nm, respectively. The distances between the center resonance wavelength $\lambda c$ and the side resonance wavelengths $\lambda s1$ and $\lambda s2$ are greater than those in the VCSEL illustrated in FIG. 3A. That is, although the VCSELs have nearly equal cavity thickness values (3.9 μm and 4.0 μm), the difference in refractive index of layer between these VCSELs results in a difference in the effective cavity length. The present exemplary embodiment employs the $Al_xO_y$ oxide region 104A having a smaller refractive index than that of the conductive region 104B made of n-type AlGaAs to change the effective cavity length. It is thus possible to broaden the free spectrum range (FSR) that corresponds to the interval between the resonance wavelengths and suppress longitudinal mode switching (hopping).

Figure 4:
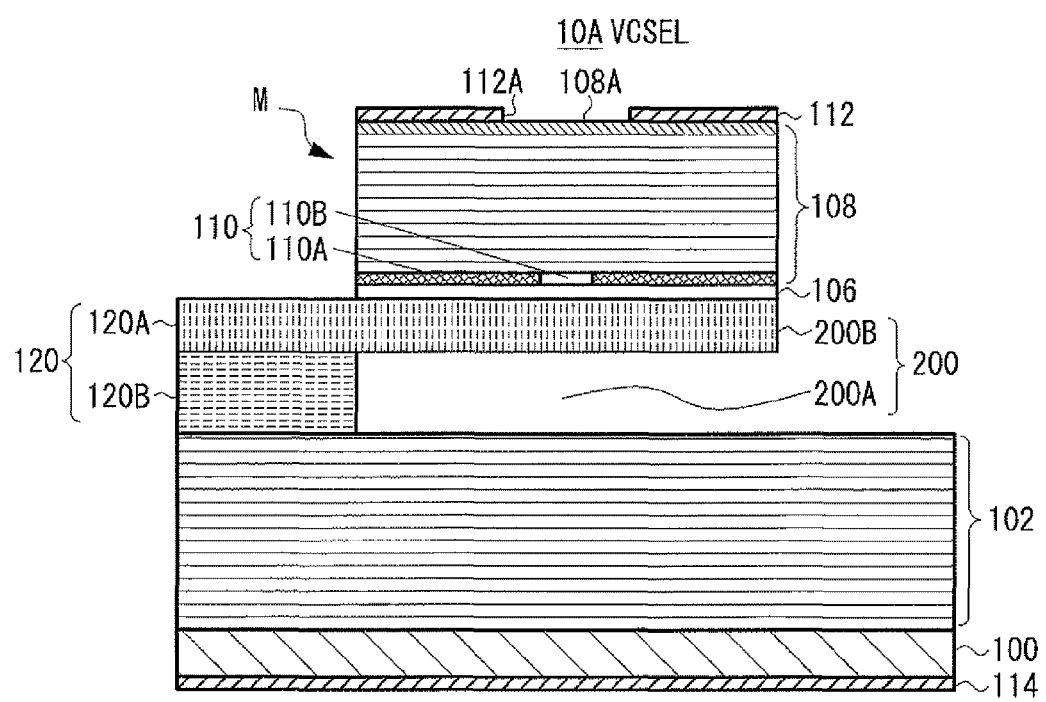
FIG. 4 is a cross-sectional view of a VCSEL with an extended cavity in accordance with a second exemplary embodiment of the present invention.

A description will now be given of a second exemplary embodiment of the present invention. FIG. 4 is a cross-sectional view of a VCSEL with an extended cavity in accordance with the second exemplary embodiment. A VCSEL 10A of the second exemplary embodiment is similar to the VCSEL of the first exemplary embodiment except a cavity region 200. More specifically, the cavity region 200 includes an air-layer region 200A substituted for the oxide region 104A employed in the first exemplary embodiment. An electrically conductive region 20013 close to the active region 106 is formed on the air-layer region 200A. Although a method for forming the air-layer region 200A will be described in detail later, the air-layer region 200A may easily be formed in the cavity region 200 by wet etching the oxide region 104A of the semiconductor layer in the first embodiment with buffered hydrofluoric acid. The air-layer region 200A is substantially a cavity space, and has a refractive index of 1, which is smaller than that of the oxide region 104A.

A graph illustrated in FIG. 5A is the same as that in FIG. 3A, and a graph illustrated in FIG. 5B illustrates a relation between the resonance wavelength and the reflection band of the VCSEL with the extended cavity in accordance with the second exemplary embodiment. The extended cavity of the second exemplary embodiment (which corresponds to the cavity region 200) is formed by an $Al_{0.3}Ga_{0.7}As$ layer by $4\lambda$ and the air-layer region 200A by $4.5\lambda$. The total thickness of the extended cavity is 4.0 μm. That is, $Al_{0.3}Ga_{0.7}As\times 4\lambda+(air\ layer)\times 4.5\lambda=4.0$ μm. As illustrated in the graph of FIG. 5B, the center resonance wavelength $\lambda c$ is about 780 nm, and the side resonance wavelengths $\lambda s1$ and $\lambda s2$ do not occur in the range in which the reflectance over 99% necessary for realizing the resonator is available. Further, the intervals between the center resonance wavelength λ L and the side resonance wavelengths λs1 and λs2 are greater than those in the case of FIG. 5A. According to even the second exemplary embodiment, the effective resonator length can be reduced by forming, in the cavity region 200, the region having a greater optical thickness than the oscillation wavelength of the cavity region 200 and having a relatively small reflectance. Thus, the free spectrum range RSR may be expanded and the longitudinal mode hopping may be suppressed.

The second exemplary embodiment may be varied so that the air-layer region 200A may be filled with resin. For example, a material having a better thermal conductivity than that of air such as polyimide resin may be used to improve the heat radiation performance.

Figure 6:
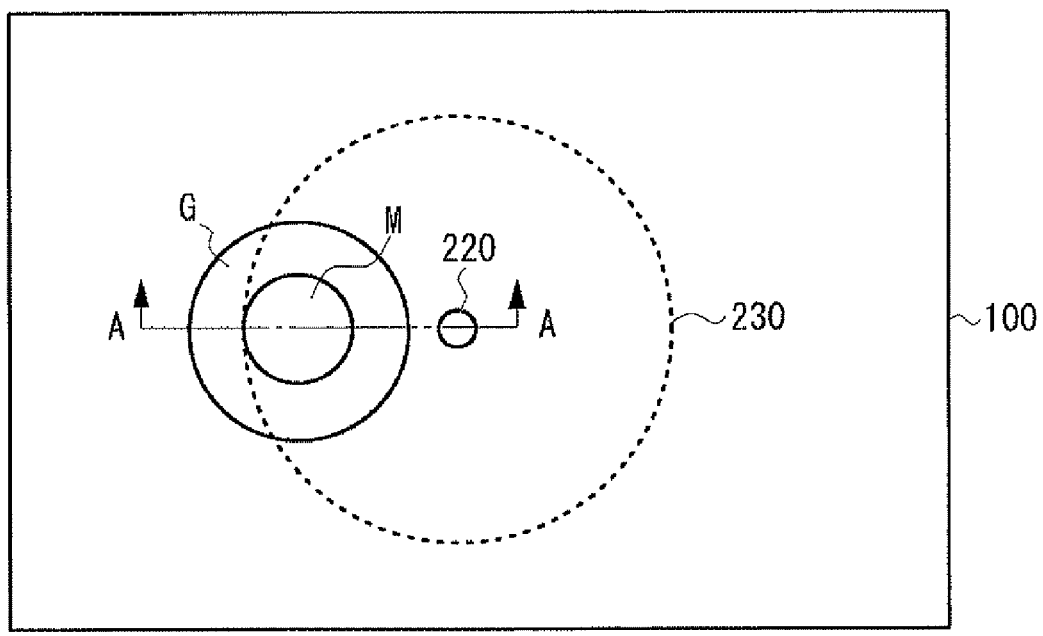
FIG. 6 is a plan view of the VCSEL with the extended cavity configured according to the first exemplary embodiment observed when an oxidation process is complete.

A description will now be given of a method for fabricating the VCSEL with the extended cavity in accordance with the first exemplary embodiment. FIG. 6 is a plan view of a structure of the VCSEL in accordance with the first exemplary embodiment observed when the oxidizing process is completed, and FIGS. 7A, 7B, 8A and 8B are respectively cross-sectional views taken along a line A-A in FIG. 6 observed at fabrication steps.

Figure 7A:
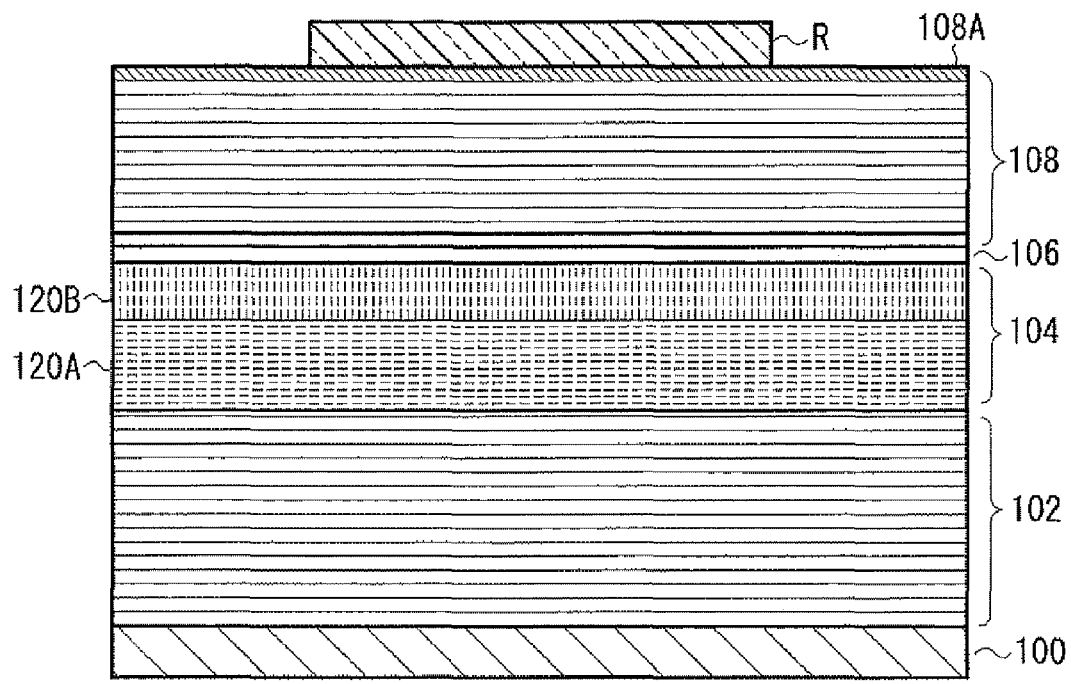
FIGS. 7A and 7B are cross-sectional views that illustrates a method for fabricating the VCSEL with the extended cavity in accordance with the first exemplary embodiment.

Referring to FIG. 7A, MOCVD (metal Organic Chemical Vapor Deposition (MOCVD) is used to sequentially stack, on the n-type GaAs substrate 100, the n-type lower DBR 102, the cavity region 104, the active region 106 and the p-type upper DBR 108. The cavity region 104 includes the n-type AlAs layer and the n-type $Al_{0.3}Ga_{0.7}As$ layer. Each layer of the lower DBR 102 is formed so as to have a thickness equal to ¼ of the wavelength in the medium. The cavity region 104 is formed so as to have a thickness equal to 10.5λ where λ is the wavelength in the medium. The current confining layer 110 made of p-type AlAs is inserted in proximity to the active region 106, and a p-type GaAs contact layer 108A is formed on the uppermost layer of the upper DBR 108.

Figure 7B:
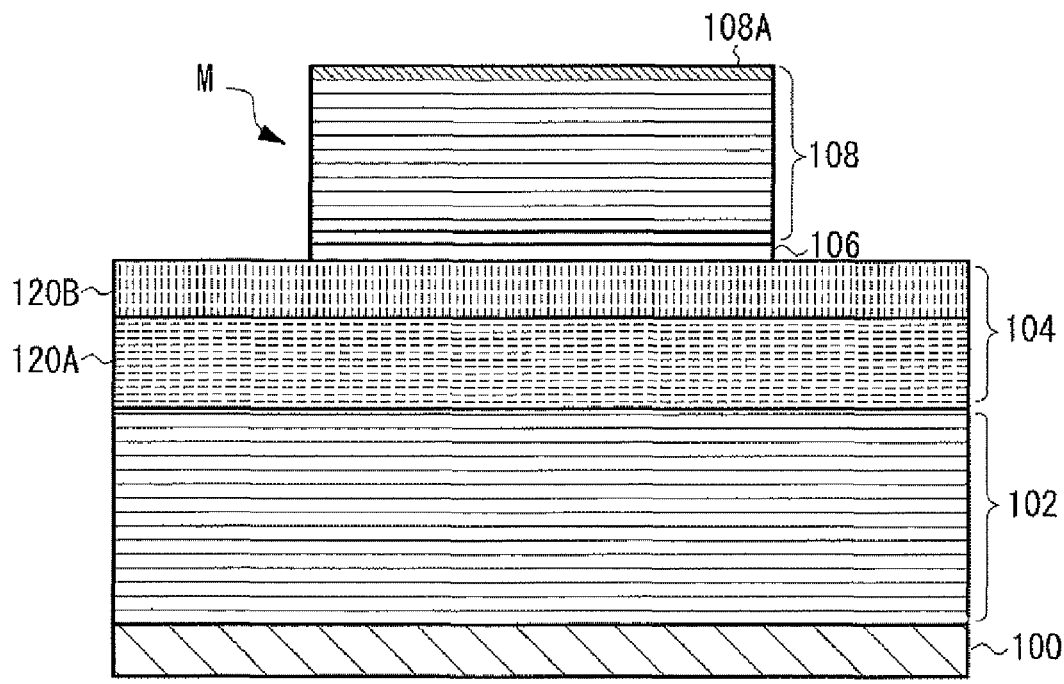

Next, a patterned circular mask R is formed on the contact layer 108A, and the semiconductor layers on the substrate are anisotropically etched using the mask R so that the cylindrical mesa M can b defined on the n-type GaAs substrate 100 as illustrated in FIG. 7B. The mesa M has a depth that reaches a part of the cavity region 104, and the conductive region 104E just below the active region 106 and the extension region 120B further out than the conductive region 104B remain on the bottom of the mesa M. The mask R may be configured to have a ring-shaped groove G as illustrated in FIG. 6. In this case, the cylindrical mesa M is defined by the ring-shaped groove G.

Figure 8A:
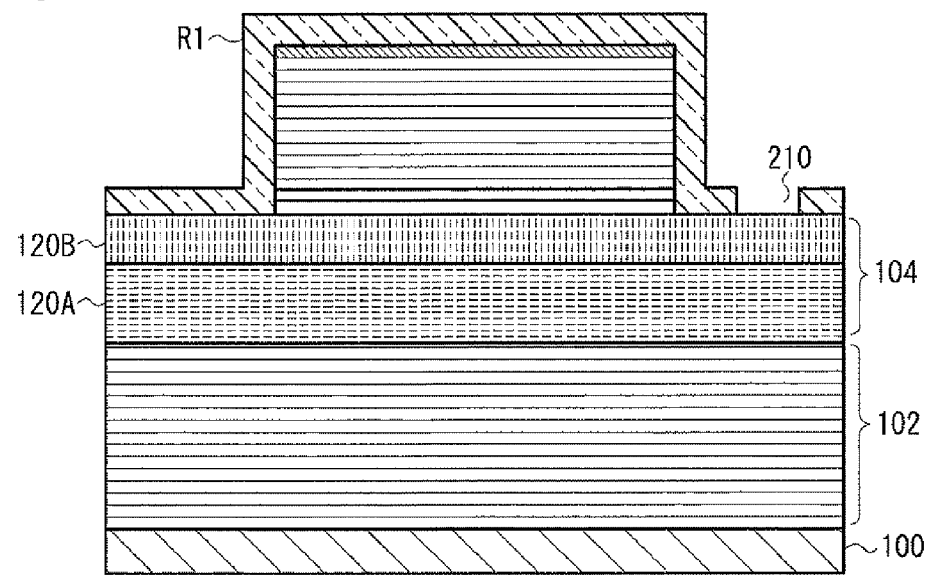
FIGS. 8A and 8B are cross-sectional views that illustrates subsequent steps of the method for fabricating the VCSEL with the extended cavity in accordance with the first exemplary embodiment.
Figure 8B:
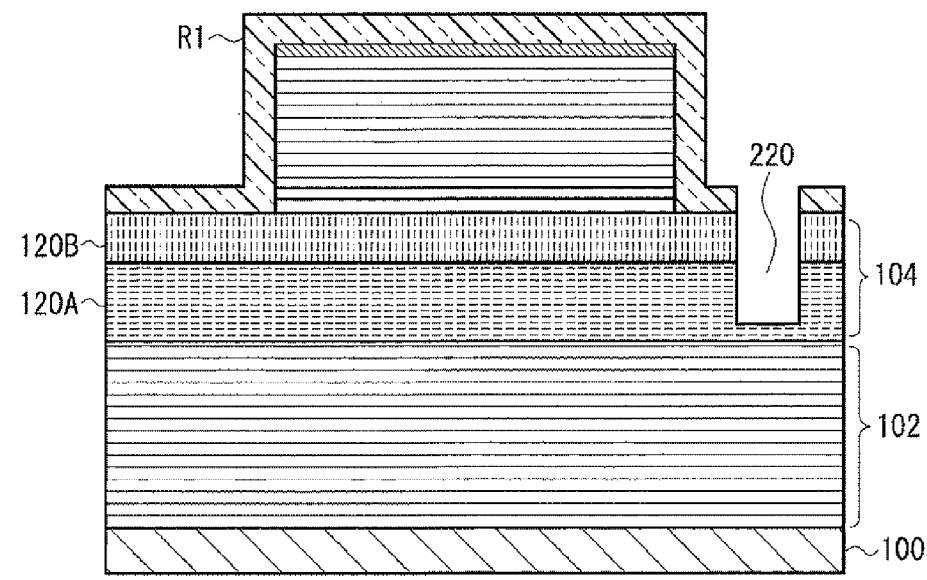

Then, the mask R is removed, and a mask R1 is formed on the n-type GaAs substrate 100 including the mesa M, as illustrated in FIG. 8A. Then, the mask R1 is patterned so that a window 210 for etching is defined on the bottom of the mesa M. Then, as illustrated in FIG. 8B, the cavity region 104 is anisotropically etched via the window 210 to form an oxide opening 220 having a circular shape so that the AlAs region can be exposed. Preferably, the oxide opening 220 has a depth that does not pierce the AlAs region.

Figure 9A:
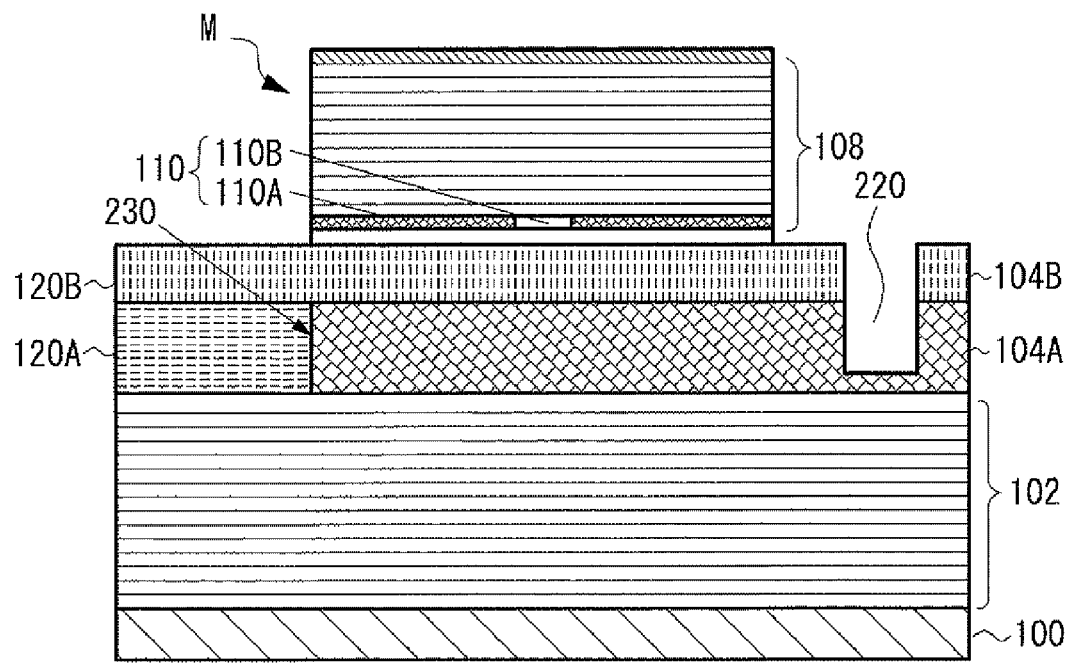
FIG. 9A is a cross-sectional view that illustrates a step of the method for fabricating the VCSEL with the extended cavity in accordance with the first exemplary embodiment.
Figure 9B:
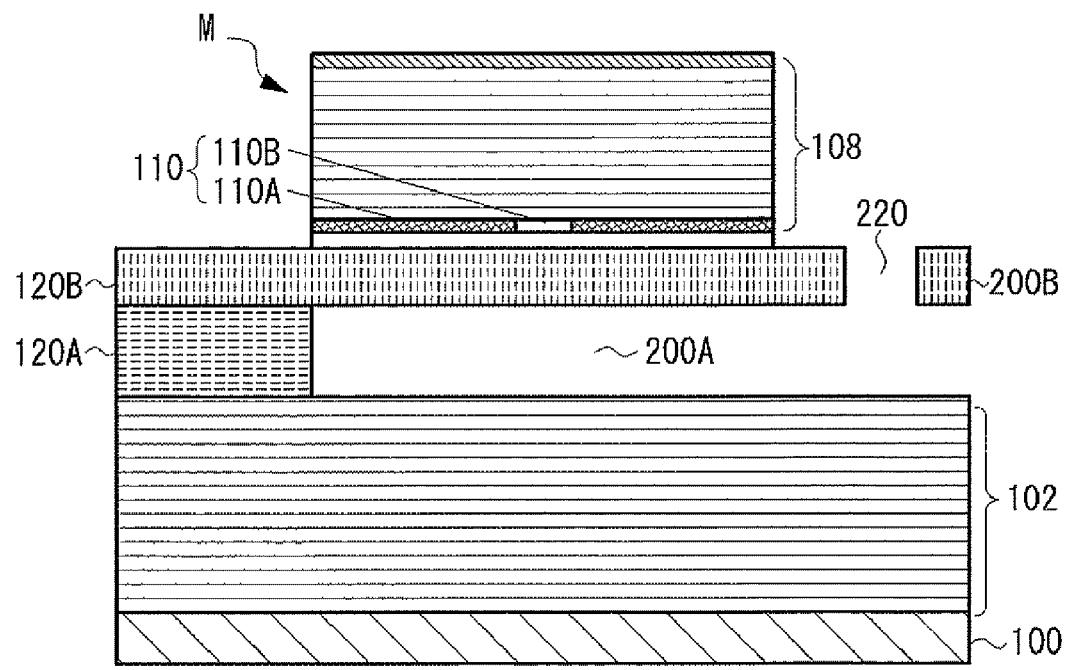
FIG. 9B is a cross-sectional view that illustrates a step of the method for fabricating the VCSEL with the extended cavity in accordance with the second exemplary embodiment.

Then, the mask R1 is removed, and the current confining layer 110 and the cavity region 104 are selectively oxidized simultaneously. In the current confining layer 110, the selective oxidation results in the oxide region 110A defined by oxidizing the mesa M from the side surface thereof, and the oxide aperture 110B surrounded by the oxide region 110A. The diameter of the oxide aperture 11013 is greater than that of the ordinary VCSEL and may be 8 µm. In the AlAs region of the cavity region 104, oxidation radially goes on from the center of the oxide opening 220 and reaches an oxidation reach position 230. Preferably, the oxidation reach position 230 substantially coincides with the outer circumference of the mesa M, as illustrated in FIGS. 6 and 9B, and AlAs just below the active region 106 is changed to the oxide region 104A having $Al_xO_y$. Further, the non-oxide region 120A of AlAs that has not been oxidized and the conductive region 120B formed thereon are formed further out than the oxidation reach position 230. These regions define the current path region 120. The diameter of the oxide aperture 110B, the thickness of the current confining layer 110, the thickness of the oxide region 104A, and the Al compositions thereof may be appropriately adjusted to realize an identical oxidation time and simultaneous oxidation in order to obtain a desired size of the diameter of the oxide aperture 110B and a desired size of the selectively oxidized region of the oxide region 104A.

Then, the p-side electrode 112 is formed on the upper DBR 108 by a liftoff process. The p-side electrode 112 may be formed on the contact layer of the upper DBR 108 before the mesa M is formed. After that, an interlayer insulating film such as SiON is formed on the whole substrate surface including the mesa M by CVD. Finally, the n-side electrode 114 is formed on the back surface of the n-type GaAs substrate 100.

The VCSEL of the second exemplary embodiment may be varied as illustrated in FIG. 9B in which the oxide region 104A is removed by selective etching through the oxide opening 220 with buffered hydrofluoric acid so that the oxide region 104A is replaced by the air-layer region 200A.

The optical thickness values of the cavity regions 104 of the first and second exemplary embodiments are set equal to 10.5λ and 8.5λ, respectively. However, these values are just examples and arbitrary values may be selected from the range of 10λ to 20λ. It is to be noted that the resonator length increases, the number of resonance wavelengths increases proportionally. The low refractive index region formed in the cavity region 104 may be formed by a material other than the oxide region 104A and the air-layer region 200A, and the optical film thickness thereof may be selected taking the relation with the refractive index into account.

In the above-described exemplary embodiments, the VCSELs are of selective oxidation type. The current confining layer may be formed by proton ion implantation. In this case, the mesa may be omitted. The diameter of the oxide aperture of the current confining layer may be changed taking the desired optical output into consideration. The present invention is not limited to the GaAs-based VCSELs but may include VCSELs of an extended cavity using another III-V compound semiconductor. The above-described exemplary embodiments are the VCSELs having a single spot. The present invention includes a multi-spot VCSEL having multiple spots (light emitting parts) formed on a substrate or a VCSEL array.

Figure 10A:
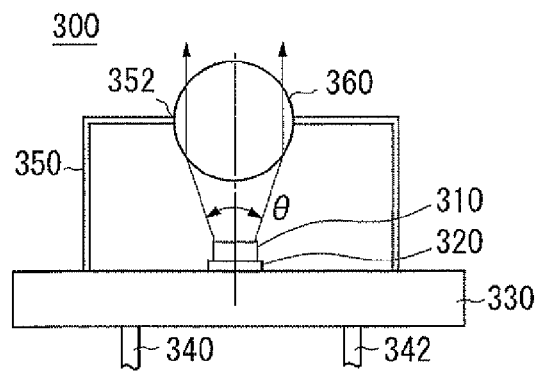
FIG. 10A is a cross-sectional view of a VCSEL device in accordance with an exemplary embodiment of the present invention.

A description will now be given of a surface emitting semiconductor laser device, an optical information processing apparatus and an optical transmission device. FIG. 10A is a cross-sectional view of a VCSEL device in which the VCSEL and an optical component are packaged. A VCSEL device 300 is configured so that a chip 310 on which the VCSEL with the extended cavity is formed is fixed to a disk-shaped metal stem 330 by an electrically conductive adhesive 320. Electrically conductive leads 340 and 342 are inserted into through holes formed in the stem 330. The lead 340 is electrically connected to the n-side electrode of the VCSEL, and the lead 342 is connected to the p-side electrode.

A hollow cap 350 having a rectangular shape is fixed to the stem 330 including the chip 310, and a ball lens 360 of the optical component is fixed within a central aperture 352 of the hollow cap 350. The optical axis of the ball lens 360 is positioned so as to be substantially aligned with the center of the chip 310. A forward voltage is applied between the leads 340 and 342, and a laser beam is emitted from the chip 310 in the vertical direction. The distance between the chip 310 and the ball lens 360 is adjusted so that the ball lens 360 is included within the divergence angle θ of the laser beam with respect to the chip 310. A light receiving element or a temperature sensor for monitoring the emission state of the VCSEL may be provided within the cap.

Figure 10B:
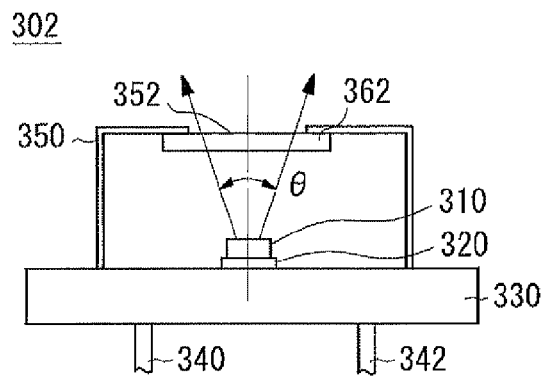
FIG. 10B is a cross-sectional view of a variation of the VCSEL device illustrated in FIG. 10A.

FIG. 10B is a cross-sectional view of another VCSEL device. A VCSEL device 302 does not employ the ball lens 360 but a plate glass 362 in the aperture 352 located at the center of the hollow cap 350. The center of the plate glass 362 is positioned so as to substantially coincide with the center of the chip 310. The distance between the chip 310 and the plate glass 362 is adjusted so that the aperture diameter of the plate glass 362 is equal to or greater than the divergence angle θ of the laser beam with respect to the chip 310.

Figure 11:
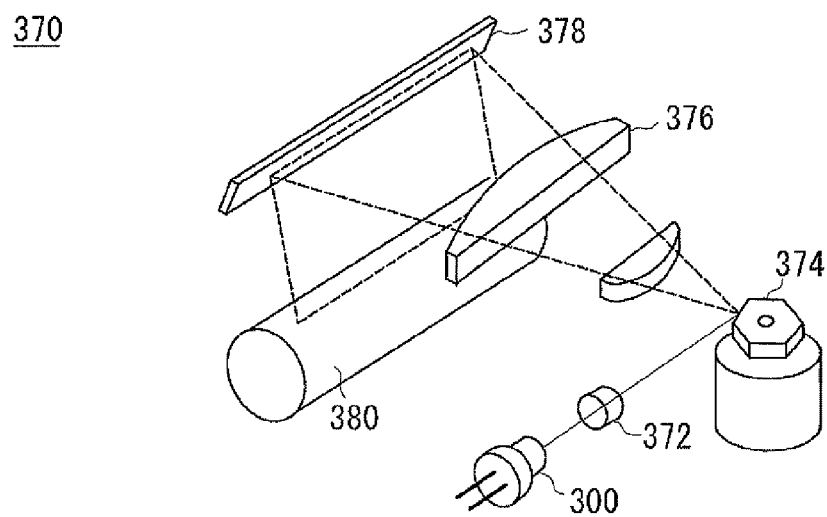
FIG. 11 is a perspective view of an optical information processing apparatus in accordance with an exemplary embodiment of the present invention.

FIG. 11 illustrates an optical information processing apparatus to which the VCSEL is applied as an optical source. An optical information processing apparatus 370 is equipped with the VCSEL device 300 or 302, a collimator lens 372, a polygon mirror 374, an fθ lens 376, a linear reflection mirror 378, and a photosensitive drum (recording medium) 380. The laser beam from the VCSEL device 300 or 302 is incident to the collimator lens 372. The polygon mirror 374 is rotated at a constant velocity, and reflects the optical flux from the collimator lens 372 at the given divergence angle. The fθ lens 376 receives the laser beam from the polygon mirror 374 and projects it onto the reflection mirror 378. A latent image is formed on the photosensitive drum 380 by the reflected light from the reflection mirror 378. The VCSEL device may be applied to an optical information processing apparatus that includes an optical system that collects the laser beam from the VCSEL onto the photosensitive drum, and a mechanism for scanning the photosensitive drum by the collected laser beam, such as a copying machine or a printing machine.

Figure 12:
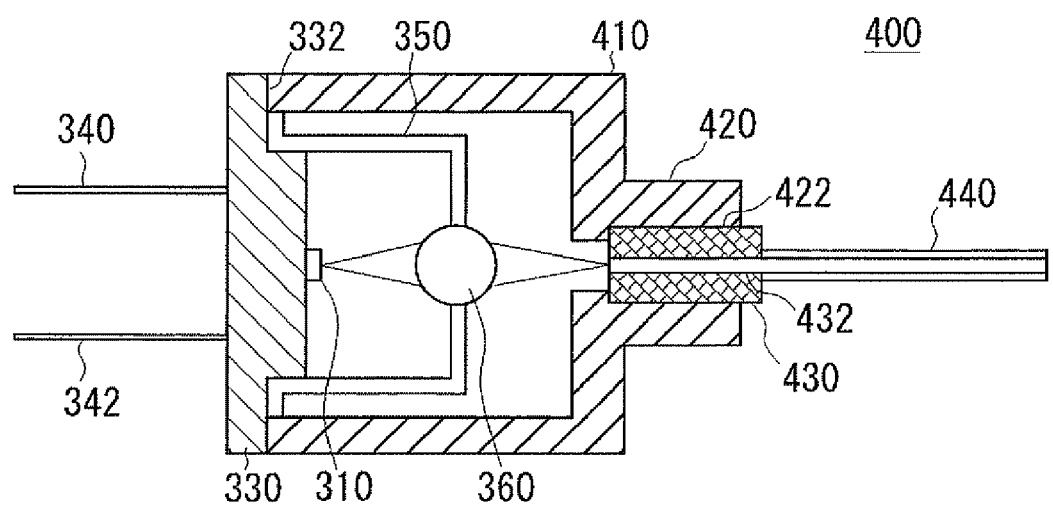
FIG. 12 is a cross-sectional view of an optical transmission device in accordance with an exemplary embodiment of the present invention.

FIG. 12 is a cross-sectional view of an optical transmission device to which the VCSEL device illustrated in FIG. 10A is applied. An optical transmission device 400 illustrated in FIG. 12 has a hollow cylindrical housing 410, a sleeve 420, a ferule 430, and an optical fiber 440. The housing 410 is fixed to the stem 330. The sleeve 420 is formed integrally with an end surface of the housing 410. The ferule 430 is held in an opening 422 of the sleeve 420. The optical fiber 440 is held by the ferule 430. An end of the housing 410 is fixed to a flange 332 formed in the circumferential direction of the stem 330. The optical axis of the optical fiber 440 is aligned with the optical axis of the ball lens 360. The core line of the optical fiber 440 is held in a through hole 432 of the ferule 430.

The laser beam emitted from the surface of the chip 310 is collected by the ball lens 360. The collected light is incident to the core line of the optical fiber 440, and is transmitted. The ball lens 360 used to collect the laser beam in the above-described structure may be replaced by another lens such as a double-convex lens or a plano-convex lens. The optical transmission device 400 may include a drive circuit for applying the electrical signal to the leads 340 and 342. The optical transmission device 400 may include a receiver function for receiving the optical signal through the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A surface emitting semiconductor laser comprising:
a substrate;
a first semiconductor multilayer reflector of a first conduction type that is formed on the substrate and is composed of stacked pairs of relatively high refractive index layers and relatively low refractive index layers;
a cavity region that is formed on the first semiconductor multilayer reflector and is close to an active region; and
a second semiconductor multilayer reflector of a second conduction type that is formed on the cavity region and is composed of stacked pairs of relatively high refractive index layers and relatively low refractive index layers,
a cavity length of a cavity that includes the cavity region and the active region between the first semiconductor multilayer reflector and the second semiconductor multilayer reflector being greater than an oscillation wavelength,
the cavity region including an electrically conductive region of the first conduction type in proximity to the active region, and a low refractive index region that is interposed between the electrically conductive region and the first semiconductor multilayer reflector and has a smaller refractive index than that of the electrically conductive region, and
a current path region that is located in an outer circumferential part of the low refractive index region and is electrically connected to the first semiconductor multilayer reflector.

2. The surface emitting semiconductor laser according to claim 1, wherein the low refractive index region is an oxide region.

3. The surface emitting semiconductor laser according to claim 1, wherein the electrically conductive region has a refractive index between the relatively high refractive index layer of the first semiconductor multilayer reflector and the relative low refractive index layer thereof, and the oxide region has a smaller refractive index than that of the relatively low refractive index layer.

4. The surface emitting semiconductor laser according to claim 2, wherein the cavity region includes a layer that is interposed between the electrically conductive region and the oxide region and has a function of suppressing oxidation.

5. The surface emitting semiconductor laser according to claim 2, wherein the electrically conductive region is a compound semiconductor layer having an Al composition, and the oxide region includes a layer defined by oxidizing the compound semiconductor layer including the Al composition.

6. The surface emitting semiconductor laser according to claim 1, wherein the low refractive index region includes an air-layer region.

7. The surface emitting semiconductor laser according to claim 6, wherein the air-layer region is defined by etching an oxidized semiconductor region.

8. The surface emitting semiconductor laser according to claim 6, wherein the air-layer region has an optical thickness greater than that of a spacer layer included in the active region.

9. The surface emitting semiconductor laser according to claim 1, further comprising a current confining layer interposed between the first semiconductor multilayer reflector and the second semiconductor multilayer reflector, and the current confining layer includes an oxide region and an electrically conductive aperture surrounded by the oxide region.

10. The surface emitting semiconductor laser according to claim 9, wherein the oxide region of the current confining layer is simultaneously oxidized with an oxide region of the low refractive index region.

11. The surface emitting semiconductor laser according to claim 1, wherein a resonator formed by the first semiconductor multilayer reflector, the cavity region and the second semiconductor multilayer reflector includes multiple resonance wavelengths.

12. A surface emitting semiconductor laser device comprising:
    a surface emitting semiconductor laser; and
    an optical component to which light emitted by the surface emitting semiconductor laser is incident,
    the surface emitting semiconductor laser including:
    a substrate;
    a first semiconductor multilayer reflector of a first conduction type that is formed on the substrate and is composed of stacked pairs of relatively high refractive index layers and relatively low refractive index layers;
    a cavity region that is formed on the first semiconductor multilayer reflector and includes an active region; and
    a second semiconductor multilayer reflector of a second conduction type that is formed on the cavity region and is composed of stacked pairs of relatively high refractive index layers and relatively low refractive index layers,
    a cavity length of a cavity that includes the cavity region and the active region between the first semiconductor multilayer reflector and the second semiconductor multilayer reflector being greater than an oscillation wavelength,
    the cavity region including an electrically conductive region of the first conduction type in proximity to the active region, and a low refractive index region that is interposed between the electrically conductive region and the first semiconductor multilayer reflector and has a smaller refractive index than that of the electrically conductive region, and
    a current path region that is located in an outer circumferential part of the low refractive index region and is electrically connected to the first semiconductor multilayer reflector.

13. An optical transmission device comprising:
    a surface emitting semiconductor device including a surface emitting semiconductor laser and an optical component to which laser emitted by the surface emitting semiconductor laser is incident; and
    a transmission part that transmits the light emitted from the surface emitting semiconductor laser device through an optical medium,
    the surface emitting semiconductor laser including:
    a substrate;
    a first semiconductor multilayer reflector of a first conduction type that is formed on the substrate and is composed of stacked pairs of relatively high refractive index layers and relatively low refractive index layers;
    a cavity region that is formed on the first semiconductor multilayer reflector and includes an active region; and
    a second semiconductor multilayer reflector of a second conduction type that is formed on the cavity region and is composed of stacked pairs of relatively high refractive index layers and relatively low refractive index layers,
    a cavity length of a cavity that includes the cavity region and the active region between the first semiconductor multilayer reflector and the second semiconductor multilayer reflector being greater than an oscillation wavelength,
    the cavity region including an electrically conductive region of the first conduction type in proximity to the active region, and a low refractive index region that is interposed between the electrically conductive region and the first semiconductor multilayer reflector and has a smaller refractive index than that of the electrically conductive region
    a current path region that is located in an outer circumferential part of the low refractive index region and is electrically connected to the first semiconductor multilayer reflector.

* * * * *